United States Patent
Mahanpour et al.

(10) Patent No.: US 6,770,512 B1
(45) Date of Patent: Aug. 3, 2004

(54) METHOD AND SYSTEM FOR USING TMAH FOR STAINING COPPER SILICON ON INSULATOR SEMICONDUCTOR DEVICE CROSS SECTIONS

(75) Inventors: Mehrdad Mahanpour, Union City, CA (US); Mohammad Masoodi, Los Altos, CA (US); Bryan M. Tracy, Oakland, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/316,592

(22) Filed: Dec. 10, 2002

(51) Int. Cl.[7] .............................................. H01L 29/00

(52) U.S. Cl. ....................................... 438/110; 257/347

(58) Field of Search ........................... 438/110; 257/347

(56) References Cited

U.S. PATENT DOCUMENTS 5,421,958 A * 6/1995 Fathauer et al. ............... 216/48

\* cited by examiner

*Primary Examiner*—Fetsum Abraham
(74) *Attorney, Agent, or Firm*—Winstead Sechrest & Minick P.C.

(57) ABSTRACT

A method and system for performing failure analysis on a silicon on insulator (SOI) semiconductor device is disclosed. The SOI device includes a plurality of conductive structures in a silicon region. The silicon resides on a box insulator, which resides on a silicon substrate. The method and system include providing a cross-section of the SOI semiconductor device. The cross-section of the SOI semiconductor device includes a portion of the plurality of conductive structures. The method and system also include staining the cross-section of the SOI semiconductor device using a stain. The stain etches the silicon region in the SOI semiconductor device without etching a remaining portion of the SOI semiconductor device not composed of silicon.

5 Claims, 2 Drawing Sheets

METHOD AND SYSTEM FOR USING TMAH FOR STAINING COPPER SILICON ON INSULATOR SEMICONDUCTOR DEVICE CROSS SECTIONS

FIELD OF THE INVENTION

The present invention relates to semiconductor devices, and more particularly to a method and system for improving the staining of conductive structures, such as those made of copper, on silicon on insulator semiconductor devices.

BACKGROUND OF THE INVENTION

Silicon on insulator (SOI) semiconductor devices are increasingly utilized. A SOI semiconductor device includes a semiconductor substrate, or bulk silicon. On the semiconductor substrate is an insulating layer, typically silicon dioxide. The insulating layer is known as the box layer. On the box layer is silicon that is typically p-doped. The devices, such as memory cells, transistors, and junctions, are formed on the silicon. Conductive structures, such as interconnects and contacts, electrically connect devices within the SOI semiconductor device. Typically, the conductive structures are composed of copper.

Often, the circuits in SOI semiconductor devices include one or more faults. In particular, one or more of the conductive structures may have a fault such as a short or an open circuit. In order to investigate the nature of the faults, the SOI semiconductor device is deprocessed. Conventional methods for failure analysis include exposing the conductive structures in cross sections for investigation. Once cross sections are prepared from the SOI semiconductor device, the cross sections are stained, or etched. Staining typically involves treating the cross section with a conventional stain, or selectively etchant. Portions of the SOI semiconductor device are removed by the conventional stain. Staining is used to allow the experimenter to more clearly view the conductive structures. In particular, removal of the silicon Although conventional cross-section preparation and staining can allow investigation of the conductive structures in an SOI semiconductor device, one of ordinary skill in the art will readily recognize that conventional stains do not simplify distinguishing the conductive structures from the remainder of the SOI semiconductor device. In particular, conventional stains tend to stain unwanted portions of the SOI semiconductor device. For example, most conventional stains attack structures formed of silicides and silicon nitride, such as silicon nitride spacers. Staining of both the conductive structures and other portions of the SOI semiconductor device makes the conductive structures difficult to distinguish. As a result, an investigator may be unable to detect failures in the conductive structures. For example, the presence of open circuits in interconnects or short circuits between interconnects may be overlooked. As a result, it may be difficult or impossible to adequately perform failure analysis.

Accordingly, what is needed is a system and method for improving failure analysis of conductive structures on a SOI device. The present invention addresses such a need.

SUMMARY OF THE INVENTION

The present invention provides a method and system for performing failure analysis on a SOI semiconductor device. The SOI device includes a plurality of conductive structures in a silicon region. The silicon resides on a box insulator, which resides on a silicon substrate. The method and system comprise providing a cross-section of the SOI semiconductor device. The cross-section of the SOI semiconductor device includes a portion of the plurality of conductive structures. The method and system also comprise staining the cross-section of the SOI semiconductor device using a stain. The stain etches the silicon region in the SOI semiconductor device without etching a remaining portion of the SOI semiconductor device not composed of silicon.

According to the system and method disclosed herein, the present invention provides a method and system for performing failure analysis on the conductive structures in an SOI device.

DETAILED DESCRIPTION OF THE INVENTION

The present invention relates to an improvement in failure analysis of silicon on insulator (SOI) semiconductor devices. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

Figure 1A:
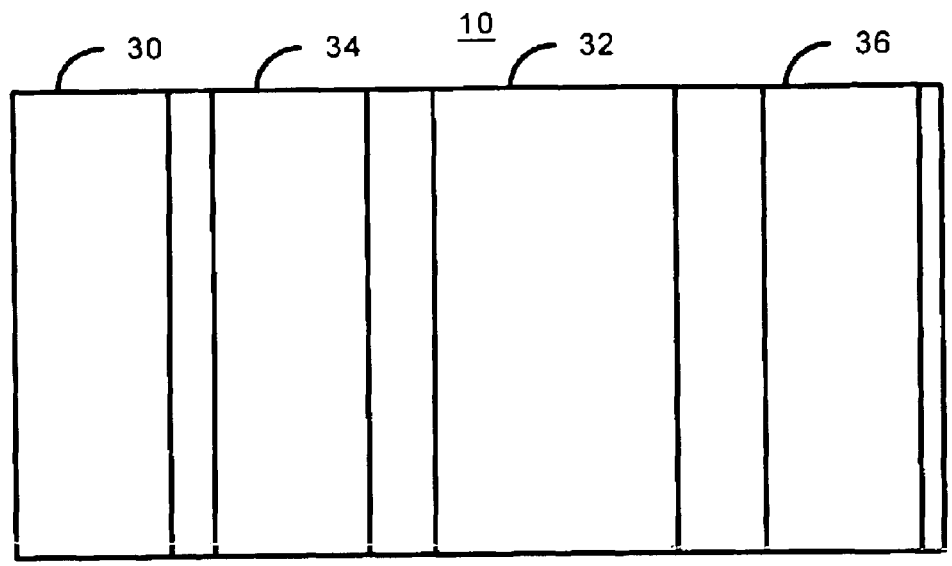
FIG. 1A is a plan view of a silicon on insulator semiconductor device.
Figure 1B:
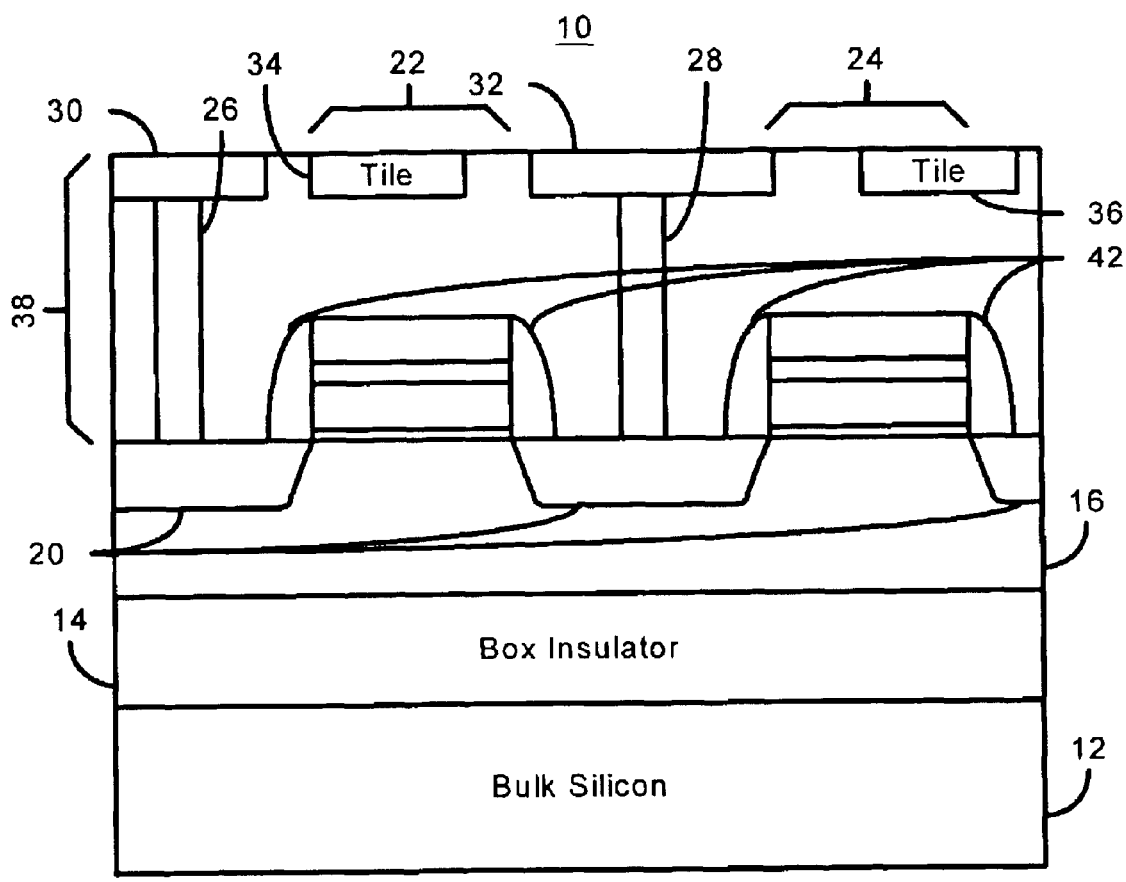
FIG. 1B is a cross-sectional view of a silicon on insulator semiconductor device.

FIGS. 1A and 1B depict a SOI semiconductor device 10. FIG. 1A depicts a plan view of a portion of the SOI semiconductor device 10. FIG. 1B depicts a cross-sectional view of the SOI semiconductor device 10. The SOI semiconductor device 10 resides on bulk silicon 12. A box insulator 14 is also provided. The box 14 is typically $SiO_2$. On the box 14 is another silicon region 16, known as the body, which includes an active region. The silicon region 16 is generally composed of p-doped silicon. The components of the SOI semiconductor device 10 are formed in and above the silicon region 16. Note that the components of the SOI semiconductor device 10 shown are for exemplary purposes. Consequently, the SOI semiconductor device 10 could include other and/or different components. The SOI semiconductor device 10 shown includes junctions 20, which could be sources and/or drains, and gate stacks 22 and 24. The gate stacks 22 and 24 typically include polysilicon. Adjacent to the gate stacks 22 and 24 are spacers 42. The spacers 42 are generally composed of a material such as silicon nitride. Also shown are conductive structures 26, 28, 30, and 32 and tiles 34 and 36 in a surrounding insulator 38. The conductive structures include contacts 26 and 28 as well as interconnects 30 and 32. The conductive structures 26, 28, 30 and 32 are typically composed of copper. However, the conductive structures 26 and 28 may also be composed of W (Tungsten). The SOI semiconductor device 10 may also include silicides (not shown).

Although the SOI semiconductor device 10 functions, one of ordinary skill in the art will readily recognize that it may be difficult to perform failure analysis on the SOI semiconductor device 10. In order to perform failure analysis on the SOI semiconductor device 10, a cross-section, such as the cross-section shown in FIG. 1B, is prepared. The cross-section of the SOI semiconductor device 10 is also stained using a conventional stain. The conventional stain is used to improve the ability to distinguish components such as one or more of the conductive structures 26, 28, 30 and 32 by removing silicon, such as the silicon region 16 or bulk silicon 12. However, conventional stains typically remove silicides and nitrides. Consequently, structures such as the spacers 42 are inadvertently removed in the staining process. As a result, it may be difficult or impossible to adequately perform failure analysis on the SOI semiconductor device 10.

The present invention provides a method and system for performing failure analysis on a SOI semiconductor device. The SOI device includes a plurality of conductive structures in a silicon region. The silicon resides on a box insulator, which resides on a silicon substrate. The method and system comprise providing a cross-section of the SOI semiconductor device. The cross-section of the SOI semiconductor device includes a portion of the plurality of conductive structures. The method and system also comprise staining the cross-section of the SOI semiconductor device using a stain. The stain etches the silicon region in the SOI semiconductor device without etching a remaining portion of the SOI semiconductor device not composed of silicon.

The present invention will be described in terms of specific stains and specific conductive structures. However, one of ordinary skill in the art will readily recognize that this method and system will operate effectively for other stains and conductive structures not inconsistent with the present invention. Furthermore, the present invention is described in the context of a method having particular steps. However, one of ordinary skill in the art will readily realize that the present invention is consistent with other and/or additional steps not inconsistent with the present invention.

Figure 2:
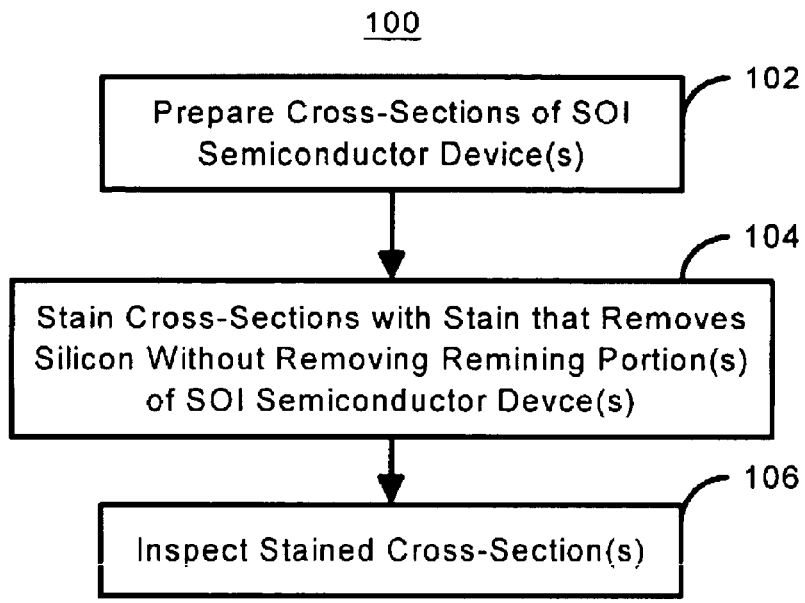
FIG. 2 is a flow chart depicting one embodiment of a method for performing failure analysis on a SOI semiconductor device.

To more particularly illustrate the method and system in accordance with the present invention, refer now to FIG. 2, depicting one embodiment of a method 100 for performing failure analysis on a SOI semiconductor device. The method 100 is described in the context of the SOI semiconductor device 10 depicted in FIGS. 1A and 1B. However, one of ordinary skill in the art will readily recognize that the method 100 is consistent with other SOI semiconductor devices (not shown).

Referring to FIGS. 1A, 1B and 2, cross-sections of the desired regions are prepared from the SOI semiconductor device 10, via step 102. Thus, cross-sections such as the one depicted in FIG. 1 are prepared. The cross-sections prepared in step 102 preferably include the conductive structures 26, 28, 30, and 32 that are of interest. For example, the cross-sections preferably include the conductive structures which are believed to have faults, such as open or short circuits (not shown). However, one of ordinary skill in the art will readily recognize that additional cross-sections not having faults may be prepared either for investigation or in order to isolate the appropriate cross-section including the fault.

The cross-sections are stained using a stain that etches silicon, but does not etch a remaining portion of the SOI semiconductor device 10, via step 104. For example, the stain would etch the silicon in region 12 and 16 without etching silicide and nitride structures, such as the junctions 20 and the spacers 42. In a preferred embodiment, the stain used in step 104 is tetra methyl ammonium hydroxide (TMAH), which etches both p and n type silicon.

Figure 3:
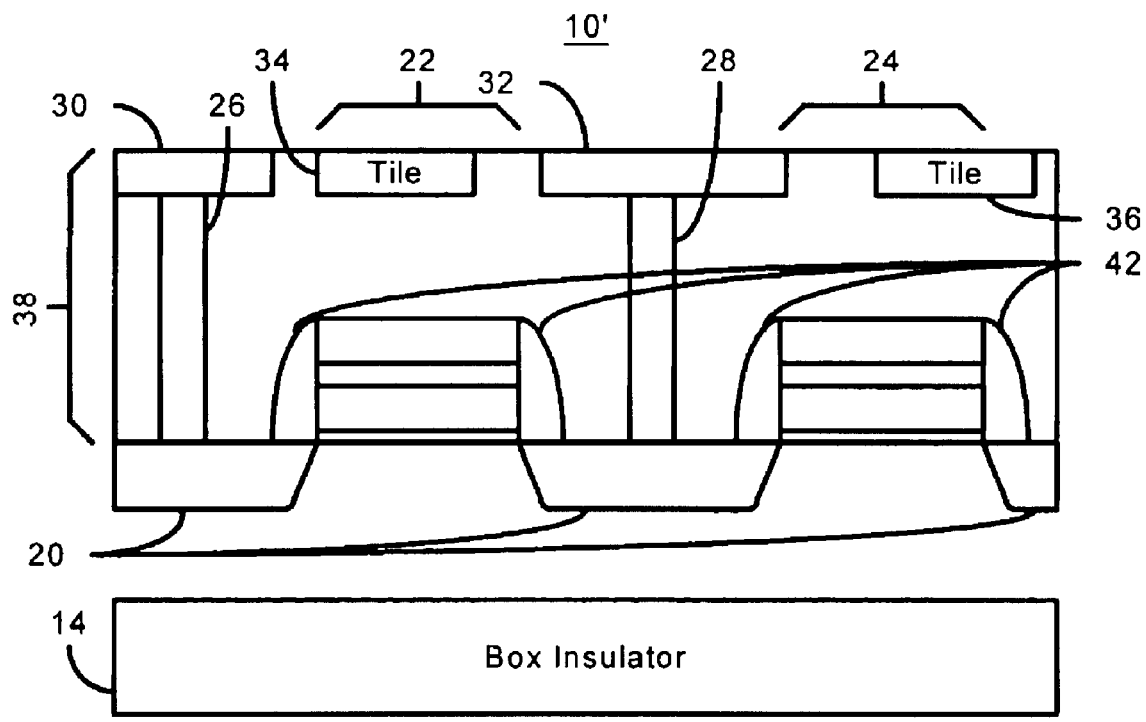
FIG. 3 is a cross-sectional view of the silicon on insulator semiconductor device after staining in accordance with the present invention.

FIG. 3 depicts a cross-section of the SOI semiconductor device 10' after staining has been performed in step 104 using TMAH as a stain. Both the bulk silicon 12 and the p-type silicon region 16 have thus been removed. In addition, gate stacks 22 and 24 are removed. As a result, spacers 42, conductive structures 26, 28, 30 and 32, tiles 34 and 36, insulator 38 and box 14 remain.

Referring to FIGS. 2 and 3, once the staining is completed, cross section of the SOI semiconductor device 10 can be investigated, via step 106. In one embodiment, step 106 may be performed using an electron microscope. Consequently, the stained cross-section 10' can be viewed and any faults in the remaining structures, including the conductive structures 26, 28, 30 and 32, can be isolated and analyzed.

In addition to, in lieu of, or to improve the above-identified method 100, failure analysis can be improved by preventing or reducing the etching of the source and drain. This etching may be reduced or eliminated by grounding the silicon region 16. During a conventional staining process of SOI semiconductor devices 10, the cathode and anode effect can cause etching of the source and drain at a high rate compared to other features. This can be applied to copper on the back end on the SOI substrate. To address the unwanted, additional etching of the source and drain, a very small pad, for example made of copper, can be deposited between the silicon region 16 for the source and drain (e.g. junction 20) and the bulk silicon 12. For example, the pad may be deposited using a FIB using a 10 pA current and may be 0.5 $\mu$m by 2–3 $\mu$m. The pad electrically connects the silicon region 16 and the bulk silicon 12. This reduces or eliminates the cathode and anode effect and thus reduces or eliminates unwanted etching of the source and drain because the cathode and anode effects generally do not occur for bulk silicon.

Furthermore, in addition to, in lieu of, or to improve the method 100, gaseous or chemical staining can be used to reduce or eliminate unwanted etching. During the FIB process or removing portions of the SOI semiconductor device 10 for failure analysis, unwanted etching of the source and/or drain (junctions 20) may occur, which would make the process, and the resulting sample of the SOI semiconductor device 10, unclear. Using a gaseous or chemical staining to eliminate the unwanted source and/or drain etching would make the staining processes clearer. Consequently, the remaining structures on the SOI semiconductor device 10 would be clearer and resolution improved.

Moreover, in addition to, in lieu of, or to improve the method 100, the source and/or drain (junction 20) may be poisoned to avoid etching. When HF and HNO$_3$ are used to decorate (stain) cross-sections for analysis, for example in a scanning electron microscope (SEM), the source and/or drain are etched, causing the gate to collapse. Poisoning the source and/or drain helps to keep the source and/or drain regions intact during staining. After the providing a cross-sectioned sample, as shown in FIG. 1B, the sample is put in a chamber in which a gas or chemical is released. The gas or chemical reacts with the dopants found in the source and/or drain regions. The gas or chemical is chosen to selectively react with the dopant(s) in the source and/or drain. The source and/or drain would thus essentially become different materials that would not be attacked/etched by HF and HNO₃ used to stain the cross section of the SOI semiconductor device 10.

A method and system has been disclosed for a system and method for performing failure analysis on a SOI semiconductor device. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A silicon on insulator (SOI) semiconductor device that has been at least partially deprocessed, the SOI device including a plurality of conductive structures in a silicon region, the silicon residing on a box insulator, the box insulator residing on a silicon substrate, the SOI semiconductor device comprising:

a cross-section of the SOI semiconductor device, the cross-section of the SOI semiconductor device including a portion of the plurality of conductive structures, the cross-section of the SOI semiconductor device being stained using a stain, the stain etching the silicon region in the SOI semiconductor device without etching a remaining portion of the SOI semiconductor device not composed of silicon.

2. The SOI semiconductor device of claim 1 wherein the portion of the plurality of conductive structures include a plurality of copper structures.

3. The SOI semiconductor device of claim 1 wherein the stain further includes Tetra Methyl Ammonium Hydroxide (TMAH).

4. The SOI semiconductor device of claim 1 further wherein the stain further etches a portion of the silicon substrate.

5. The SOI semiconductor device of claim 1 wherein the stain etches the silicon region without etching silicide or silicon nitride.

* * * * *